United States Patent [19]

Yamazaki et al.

[11] Patent Number: 4,828,668
[45] Date of Patent: May 9, 1989

[54] SPUTTERING SYSTEM FOR DEPOSITION ON PARALLEL SUBSTRATES

[75] Inventors: Shunpei Yamazaki; Kunio Suzuki, both of Tokyo; Mikio Kinka, Atsugi; Takeshi Fukada, Ebina; Masayoshi Abe, Tama; Katsuhiko Shibata, Atsugi; Hisato Shinohara, Atsugi; Masato Susukida, Atsugi, all of Japan

[73] Assignee: Semiconductor Energy Laboratory Co., Ltd., Kanagawa, Japan

[21] Appl. No.: 23,398

[22] Filed: Mar. 9, 1987

[30] Foreign Application Priority Data

Mar. 10, 1986 [JP] Japan .................................. 61-51947
Mar. 10, 1986 [JP] Japan .................................. 61-51948

[51] Int. Cl.[4] .................................................. C23C 14/34
[52] U.S. Cl. .................................. 204/298; 204/192.12
[58] Field of Search ............... 204/192.12, 192.2, 298, 204/298 PS, 298 NH, 298 EM, 298 PP

[56] References Cited

U.S. PATENT DOCUMENTS

| | | | |
|---|---|---|---|
| 3,294,670 | 12/1966 | Charschan et al. | 204/298 |
| 3,521,765 | 7/1970 | Kaufman et al. | 204/298 X |
| 3,840,451 | 10/1974 | Golyanov et al. | 204/298 |
| 4,194,962 | 3/1980 | Chambers et al. | 204/298 |
| 4,297,189 | 10/1981 | Smith, Jr. et al. | 204/298 X |
| 4,428,816 | 1/1984 | Class et al. | 204/298 |
| 4,474,659 | 10/1984 | Fazlin | 204/298 |
| 4,576,700 | 3/1986 | Kadokura et al. | 204/298 X |
| 4,601,807 | 7/1986 | Lo et al. | 204/298 |
| 4,618,477 | 10/1986 | Babu et al. | 204/298 X |

FOREIGN PATENT DOCUMENTS 0106966  6/1985  Japan .................................. 204/298

OTHER PUBLICATIONS

M. Nace et al., "High Rate . . . Targets", Journal of Crystal Growth, 45/1978, 361–364.

Primary Examiner—Nam X. Nguyen
Attorney, Agent, or Firm—Gerald J. Ferguson, Jr.

[57] ABSTRACT

An improved sputtering system for depositing film on a substrate is disclosed. The system comprises a vacuum chamber, a pair of electrodes with a target inbetween, a cart on which a plurality of substrates are mounted and a transportation mechanism for transporting the cart passing through the deposition space between the electrodes. The substrates are mounted perpendicular to the electric field induced by the pair of electrodes.

12 Claims, 4 Drawing Sheets

SPUTTERING SYSTEM FOR DEPOSITION ON PARALLEL SUBSTRATES

BACKGROUND OF THE INVENTION

This invention relates to sputtering systems for depositing film on a substrate.

Sputtering is a process for depositing a thin uniform film on a substrate in a vacuum chamber. A target made of the material to be deposited and the substrate to be coated are disposed between cathode and anode in parallel opposing relation. Argon gas introduced into the chamber at a low pressure and there ionized by electron discharge between the cathode and the anode and ejects atoms from the target which then are deposited on the facing surface of the substrate.

However, a prior art system can treat only a single substrate at once and therefore the yield is low in comparison with chemical vapor deposition. Nonetheless, only a small number of measures for increasing the yield have been proposed while there are many reports for improving the uniformity and quality of film deposited by sputtering.

SUMMARY OF THE INVENTION

It is therefore an object of the invention to provide an improved sputtering system for deposition of film at a high yield.

It is another object of the invention to provide an improved sputtering system for deposition of film in which the film can be deposited without being sputtered.

DETAILED DESCRIPTION OF THE INVENTION

Figure 1:
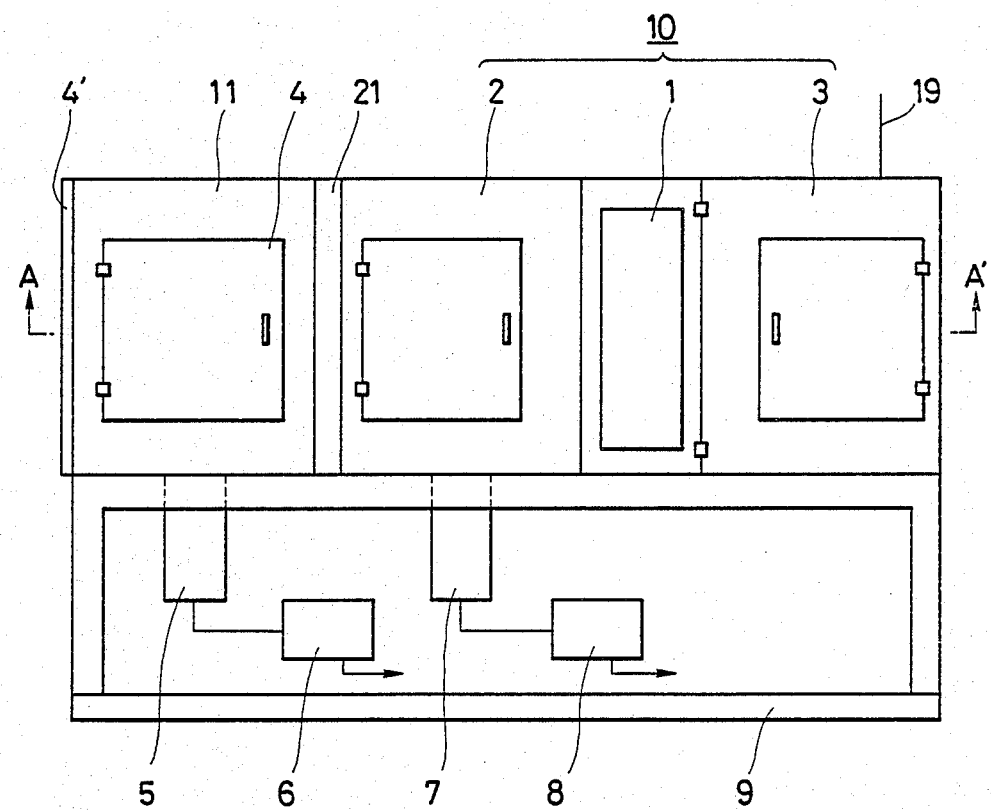
FIG. 1 is a plan view showing an embodiment of the invention.
Figure 2:
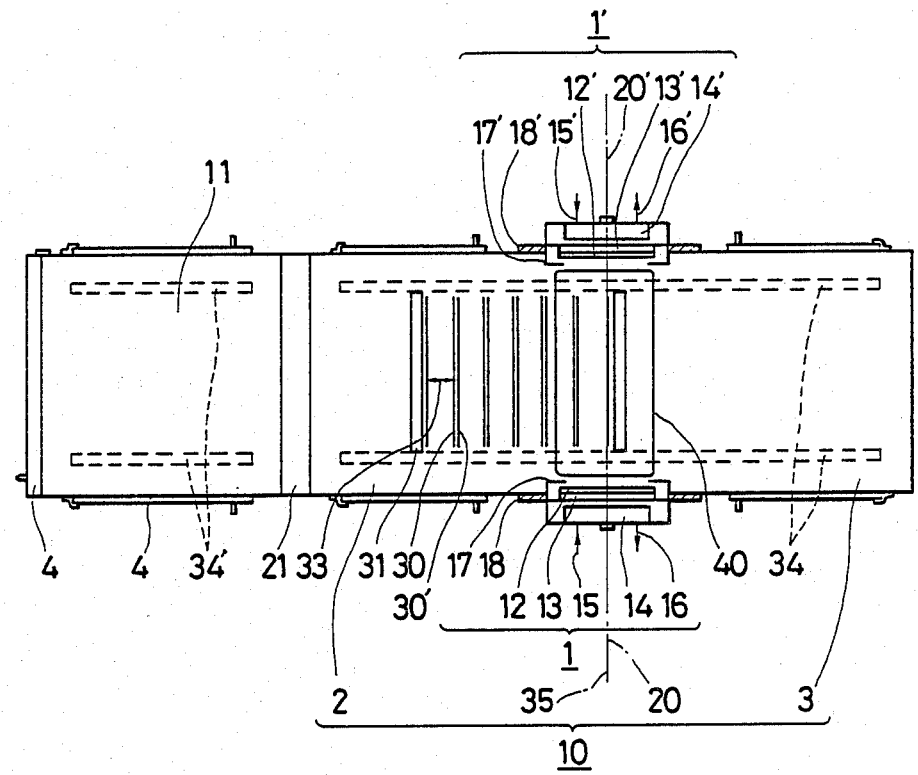
FIG. 2 is a section view along an A—A' line of FIG. 1.

Referring now to FIGS. 1 and 2, a sputtering system according to the invention is illustrated. The system is comprised of a sputtering chamber 10 and a loading chamber 11 which is separated from the sputtering chamber 10 by a valve 21. Each chamber is evacuated by a turbo molecular pump 5 or 7 accompanied by a rotary pump 6 or 8 which can extract the inside air from the chamber in advance of evacuating by the turbo molecular pump to a necessary negative pressure. Sputtering equipment 1 and 1' is provided on the front and rear sides of the sputtering chamber 10 at the middle position so that a sputtering region 1 is defined between the front and rear portions 1 and 1' of the sputtering equipment opposing to each other. The system is supported by a frame 9.

Each of the portions of the equipment on the opposed sides is composed of a target 12 or 12' which is formed by pressuring from a solid material for film formation, a backing plate 13 or 13' behind the targets 12 or 12', a magnet 14 or 14', an inlet 15 or 15' for cooling water, an outlet 16 or 16' for the cooling water and a shield plate 17 and 17'. The backing plates 13 and 13' have to be electrodes when the targets 12 and 12' are made from a insulating material. In a prefered mode of this invention, the backing plates are made of a metal and the targets are applied to the insides of the backing plates. The equipment are isolated from the other parts of the system by TEFLON insulating films 18 and 18'. The equipment gives rise to a plasma state in the deposition region between the pair of the targets 12 and 12' functioning as electrodes by virtue of electric power supply from lines 20 and 20'. A plurality of substrates 30 and 30' are mounted respectively back to back on a cart 31 which can be transported along transportation means 34 and 34' from the loading chamber 11 to the sputtering chamber 10 and from the left side to the right side of the sputtering chamber 10. In this arrangement, the back surface of the substrate not to be coated can be placed free from deposition. The substrates 30 and 30' are arranged in the perpendicular direction to the transportation direction of the cart 31 (the perpendicular direction to the plane of the drawing) with an interval of 2 to 10 cm between adjacent pairs of substrates.

The plurality of substrates to be coated are placed into the loading chamber 11 through a load-locking door 4 or a door formed on the left end of the loading chamber 11. After evacuating the loading chamber 11, the substrates are transported to the sputtering chamber 10 with the valve 21 opened, changing the transportation means from 34' to 34. The sputtering chamber 10 is filled with argon gas and preferably oxygen gas from a line 19 at a certain negative pressure from a line 19.

The plurality of the substrates 30 and 30' are coated by deposition of the material sputtered from the targets 12 and 12', during passing through the state produced by the equipment 1 and 1' in the deposition space 40. The thickness of the deposited film can be controlled by adjusting the speed of the cart passing from the left side 2 of the sputtering chamber 10 to the right side 3 of the sputtering chamber 10. Alternatively, the thickness is increased by reciprocating the cart 31 between the left side 2 and the right side 3 of the sputtering chamber 10.

Such a configuration where the electric field between the opposite targets is parallel to the plane of the substrates to be coated, is advantageous because the velocity vector of the sputtering argon ions is approximately parallel to the plane of the substrates so that the substrates are placed free from sputtering. For this reason, the quality of the film is improved.

Figure 3A:
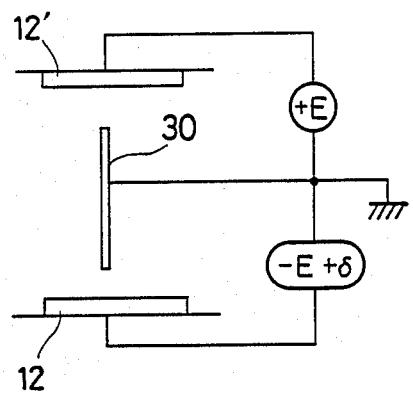
FIGS. 3(A) to 3(C) are schematic views showing several modes of electric power supply.
Figure 3B:
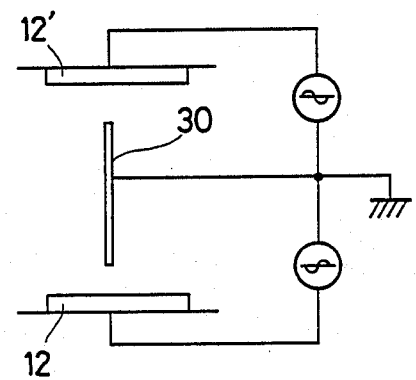
Figure 3C:
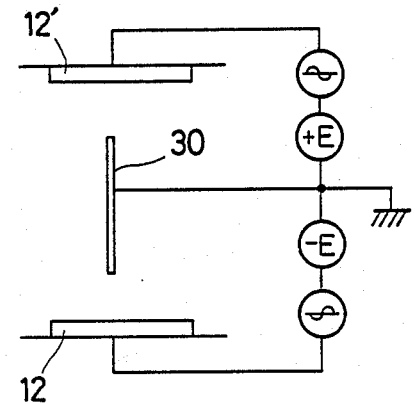
Figure 4A:
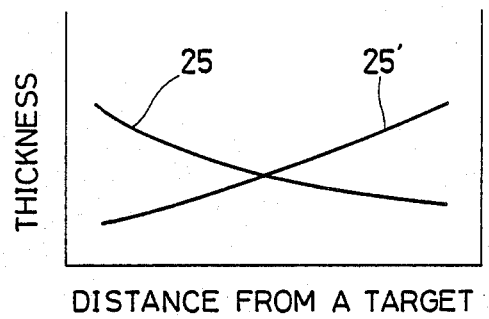
FIGS. 4(A) and 4(B) are graphical diagrams showing the relationship between the distance from a target and the thickness.
Figure 4B:
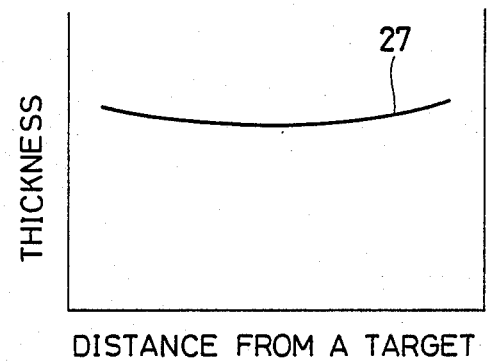

The power supplying configuration is depicted in FIGS. 3(A) to 3(C). When DC sputtering is desired, the target 12' is biased by a positive voltage while the other target 12 is biased by a negative voltage, and the substrates are grounded as shown in FIG. 3(A). Although, in a standard condition, the positive voltage and the negative voltage are same in absolute value, they may be adjusted asymmetrically in correspondence to the asymmetrical configuration of the system. The curve 25 in FIG. 4(A) shows the thickness of deposited film versus the distance from one of the targets by the power supply from the target and the curve 25' shows the thickness versus the distance from the target by the power supply from the other target. The curve 27 in FIG. 4(B) is the sum of the thicknesses illustrated by curves 25 and 25'. Such a DC sputtering is suitable especially for deposition of conductive material, e.g., a transparent conductor such as indium tin oxide or a metal such as aluminium, molybdenum, chromium or so on.

When AC sputtering is desired, the targets 12 and 12' are supplied with radio frequency electric power in opposite phases as shown in FIG. 3(B). While the substrate is grounded in the figure, it can be floating by insulating the substrates from the others. When the substrate is disposed floating, current loss through the substrate can be avoided, which may occur, in a structure with a grounded substrate, by current leakage from either target to the ground through the grounded substrate. The floating substrates are accorded a self-bias potential and repulse the sputtering particles. By virtue of the alternating voltage, argon ions shuttle while sputtering the surfaces of the both targets. Such AC sputtering is used for deposition of a resistance material, an insulating material or a low conductive material such as a transparent conductive material, titanium nitride, aluminium nitride, silicon oxide, tantalum, alumina, silicon nitride or so forth. Besides it, AC voltages in the opposed phases which are superimposed on opposite DC voltages are also used as shown in FIG. 3(C).

In virtue of the non-sputtering deposition, the film thus deposited may be obtained with micro-crystalline structure. Also with a grounded substrate, the particles of the film deposited thereon are strongly congregated so that the contact between the film and the substrate is very tight.

Experiment 1:

A pair of targets 12 and 12' made of indium tin oxide are placed at a distance of 30 cm. The pressure of argon in the sputtering chamber 10 is $4 \times 10^{-1}$ Pa and the pressure of oxide is $5.3 \times 10^{-3}$ Pa. The output powers from the target 12 side and the target 12' side are same, for example, DC power of 1000 W+1000 W (2,000W) and thereafter of 3000 W+3000 W (6,000W). Forty (namely, twenty pairs) substrates 30 and 30' 20 cm wide 60 cm long are mounted on the cart 31 with the interval of 10 cm between adjacent pairs of substrates. On the cart the 60 cm long side of the substrate are in vertical direction in the figure.

In advance of experimenting with continuous formation on a plurality of the substrates, sputtering was carried out without moving the substrates. As a result, the deposition speeds of 800° Å/min and thereafter 2800° Å/min at the center portion and the deposition speeds of 900° Å/min and thereafter 3000° Å/min at the periphery portion are obtained.

Next, sputtering was carried out with the substrates 30 and 30' passing through the plasma space 40 at 10 cm/min. After the sputtering for 10 minutes, a film was deposited on each substrate with 2700° Å in average thickness. Namely the total deposition rate was 48000 cm² per ten minutes (20 cm width × 60 cm length × 40 substrates). The deposition rate is several times larger than that obtained by prior art sputtering system for deposition. The sheet resistance of the deposited film was $4 \times 10^{-4}$ ohmcm at a room temperature. When the substrate were heated to 350° C. by a halogen lamp heater before or after deposition in the plasma space, the sheet resistance was $2 \times 10^{-4}$ ohmcm, a half of obtained without heating.

The thickness can be doubled by returning the cart from the right side 3 of the chamber 10 through the plasma space again or by reducing the moving speed of the cart to the half.

Experiment 2:

The targets were made from aluminium. The pressure of argon was $4 \times 10^{-1}$ Pa. Oxygen was not introduced. DC output power was 3000W+3000W. Other conditions were same as those of the Experiment 1. The thickness per minute of the deposited aluminium was 1000Å at the periphery of the substrate and 900°Å at the center position.

Experiment 3:

The power was supplied from AC voltage and the substrates were placed in a floating condition. The substrate was coated after heated to 300° C. in the left side of the sputtering chamber 10. Then, the sheet resistance of deposited film was $6 \times 10^{-5}$ ohmcm, about ¼ of the film with the same thickness deposited according to the method as explained in Experiment 1.

According to this invention, the substrates to be coated are not placed in such an attitude, like prior art, as perpenducular to the electric field induced by opposed electrodes (targets). This brings about two effects. One is that a plurality of substrates can be disposed in plasma between the electrodes. And the other is that direct sputtering of the substrate is avoided. In this sense, it is easily understood that the substrates do not necessarily has to be just along the direction of the electric field between the electrodes as shown in FIG. 2. For instance, if the substrate is disposed inclined at an angle $\theta$ from the plane normal to the electric field (the up and down direction in FIG. 2), the sputtering power on the surface of the substrate is reduced by $\sin \theta$ because the sputtering ions pass through large area because the sputtering ions largely pass along the electric region. In the configuration described above, the angle is preferably chosen within the range of 70° to 110°.

Although the present invention is explained in conjunction with a particular embodiment, it should not be limited thereto but only limited to the appended claims and many variations occur to those skilled in the art. For instant, an unloading chamber can be provided on the right side of the sputtering chamber 10 so that deposition can be carried out without interruption, using a plurality of carts.

What is claimed is:

1. A sputtering device comprising:
    a vacuum chamber;
    a vacuum pump for evacuating said vacuum chamber;
    a pair of targets being arranged opposite to each other in said chamber and forming a sputtering space in between;
    a power supply for supplying an alternating voltage between said targets; and
    means for supporting a plurality of substrates between said targets, said substrates being supported with major surfaces in an alignment substantially parallel to the electric field induced between said targets and said substrates being at grounded potential.

2. A sputtering system comprising:
    a vacuum chamber;
    a vacuum pump for said vacuum chamber;
    a pair of targets being opposite to each other and forming a sputtering space in between;
    a power supply for supplying an alternating voltage between said targets in a manner that, during sputtering, the gross time for which one target functions as an anode and the other as a cathode is the same as the gross time for which the one target functions as a cathode and the other as an anode; and
    means for supporting a plurality of substrates between said targets, said substrates being supported with major surfaces in an alignment substantially parallel to the electric field induced between said target and said substrates being at ground potential.

3. A sputtering system of claim 1 or 2 further comprising a cart provided with said supporting means thereon and a transportation mechanism for transporting said cart in a direction passing through the sputtering space between said targets.

4. A sputtering system of claim 3 wherein said supporting means supports thereon a plurality of substrates back to back.

5. A sputtering system of claim 3 further comprising means for grounding said substrates supported in said chamber.

6. A sputtering system of claim 5 wherein said targets are biased by the same level in the opposed phases.

7. A sputtering system of claim 3 wherein said supporting means supports said substrates in a floating condition.

8. A sputtering system of claim 7 wherein said targets are supplied with said RF voltage in the opposed phases.

9. A sputtering system of claim 7 wherein said power supply is composed of an RF voltage source and a DC voltage source connected in series.

10. A sputtering system of claim 3 wherein said power supply is an RF voltage source.

11. The system of claim 1 wherein said supporting means is a cart which can be moved through said sputtering space.

12. The system of claim 11 wherein two substrates are mounted on said cart back-to-back.

* * * * *